(12) United States Patent
Kale et al.

(10) Patent No.: US 7,872,686 B2
(45) Date of Patent: Jan. 18, 2011

(54) INTEGRATED LENS AND CHIP ASSEMBLY FOR A DIGITAL CAMERA

(75) Inventors: Vidyadhar Sitaram Kale, Lake Oswego, OR (US); Samuel Waising Tam, Daly City, CA (US); Dongkai Shangguan, San Jose, CA (US)

(73) Assignee: Flextronics International USA, Inc., Milpitas, CA (US)

( * ) Notice: Subject to any disclaimer, the term of this patent is extended or adjusted under 35 U.S.C. 154(b) by 961 days.

(21) Appl. No.: 10/784,102

(22) Filed: Feb. 20, 2004

(65) Prior Publication Data
US 2005/0185088 A1    Aug. 25, 2005

(51) Int. Cl.
*H04N 5/225* (2006.01)
*H01L 23/02* (2006.01)
*H01L 21/00* (2006.01)

(52) U.S. Cl. .................... 348/374; 257/680; 438/65
(58) Field of Classification Search ............ 438/59, 438/60, 65; 348/374, 335, 340, 373; 257/680
See application file for complete search history.

(56) References Cited

U.S. PATENT DOCUMENTS

| | | | |
|---|---|---|---|
| 4,894,707 A | 1/1990 | Yamawaki et al. ............ 357/74 |
| 6,122,009 A | 9/2000 | Ueda ........................ 348/335 |
| 6,384,397 B1 | 5/2002 | Takiar et al. ............ 250/208.1 |
| 6,414,299 B1 | 7/2002 | Churei | |
| 6,476,417 B2* | 11/2002 | Honda et al. ................ 257/59 |
| 6,686,588 B1 | 2/2004 | Webster et al. ............. 250/239 |
| 6,734,419 B1 | 5/2004 | Glenn et al. ................ 250/239 |
| 6,741,405 B1 | 5/2004 | Chen ........................ 359/813 |
| 6,798,031 B2* | 9/2004 | Honda et al. ................ 257/433 |
| 7,009,654 B2* | 3/2006 | Kuno et al. ................. 348/374 |
| 7,061,106 B2 | 6/2006 | Yang et al. ................. 257/723 |
| 7,091,571 B1 | 8/2006 | Park et al. | |
| 7,122,787 B2* | 10/2006 | Nishizawa ................. 250/239 |

(Continued)

FOREIGN PATENT DOCUMENTS

EP    0 813 236    12/1997

(Continued)

OTHER PUBLICATIONS http://zenith.czechtrade.us/acrylic-glass, 2007.*

(Continued)

*Primary Examiner*—David L Ometz
*Assistant Examiner*—Dillon Durnford-Geszvain
(74) *Attorney, Agent, or Firm*—Henneman & Associates, PLC; Larry E. Henneman, Jr.

(57) ABSTRACT

A integrated camera module (10, 10*a*) for capturing video images in very small digital cameras, cell phones, personal digital assistants, and the like. A lens assembly (24, 24*a*) is rigidly affixed in relation to a sensor array area (14) of a camera chip (12) by a molding (26). The molding (26) is formed on the camera chip (12), and optionally on a printed circuit board (16, 16*a*) on which the camera chip (12) is mounted. The lens assembly (24, 24*a*) is held in place in a recess (29) of the molding (26) by an adhesive (28). The molding (26) is formed such that a precise gap (30) exists between the lens assembly (24) and a sensor array area (14) of the camera chip (12).

74 Claims, 8 Drawing Sheets

U.S. PATENT DOCUMENTS

| | | | |
|---|---|---|---|
| 7,199,438 B2 * | 4/2007 | Appelt et al. | 257/433 |
| 7,579,583 B2 | 8/2009 | Mok et al. | |
| 7,583,309 B2 | 9/2009 | Aizawa et al. | |
| 7,679,669 B2 | 3/2010 | Kwak | |
| 2002/0145676 A1 | 10/2002 | Kuno et al. | 348/340 |
| 2002/0167605 A1 | 11/2002 | Akimoto et al. | |
| 2002/0191103 A1 * | 12/2002 | Akimoto et al. | 348/374 |
| 2003/0071342 A1 | 4/2003 | Honda et al. | 257/687 |
| 2003/0137595 A1 * | 7/2003 | Takachi | 348/340 |
| 2003/0146998 A1 * | 8/2003 | Doering et al. | 348/340 |
| 2004/0012698 A1 * | 1/2004 | Suda et al. | 348/315 |
| 2004/0027687 A1 | 2/2004 | Bittner et al. | 359/694 |
| 2004/0109079 A1 * | 6/2004 | Fujimoto et al. | 348/340 |
| 2004/0189853 A1 * | 9/2004 | Takeuchi et al. | 348/340 |
| 2005/0046740 A1 | 3/2005 | Davis | 348/373 |
| 2005/0212947 A1 | 9/2005 | Sato et al. | 348/340 |
| 2005/0274883 A1 | 12/2005 | Nagano | 250/239 |
| 2005/0285016 A1 | 12/2005 | Kong et al. | |
| 2006/0006486 A1 | 1/2006 | Seo et al. | 257/433 |
| 2006/0028573 A1 | 2/2006 | Seo et al. | 348/340 |
| 2006/0044450 A1 | 3/2006 | Wolterink et al. | 348/340 |
| 2006/0132644 A1 | 6/2006 | Shangguan et al. | 348/374 |
| 2007/0058069 A1 | 3/2007 | Chen et al. | 348/340 |
| 2007/0278394 A1 | 12/2007 | Shangguan et al. | |

FOREIGN PATENT DOCUMENTS

| | | |
|---|---|---|
| EP | 1429168 A2 | 6/2004 |
| JP | 2001-292365 | 10/2001 |
| JP | 2002252796 | 9/2002 |
| JP | 2003078077 | 3/2003 |
| JP | 2003131112 | 5/2003 |
| JP | 2003219284 | 7/2003 |
| WO | WO 2004/027880 | 4/2004 |

OTHER PUBLICATIONS

PCT Application No. PCT/US2005/005139, International Search Report and Written Opinion dated Jun. 12, 2007.
PCT Application No. PCT/US2005/005139, International Preliminary Report on Patentability dated Jul. 19, 2007.
CN Application No. 20058008990.2, Office Action dated Aug. 1, 2008 (English translation).
CN Application No. 20058008990.2, Office Action dated Jun. 12, 2009 (English translation).
EP Application No. 05 713 765.5-2202, Supplementary European Search Report dated Dec. 5, 2008.
EP Application No. 05 713 765.5-2202, Office Action dated Mar. 17, 2009.
JP Application No. 2006-554218, Office Action dated Dec. 3, 2009.
U.S. Appl. No. 11/247,993, Office Action dated Dec. 26, 2008.
U.S. Appl. No. 11/247,993, Office Action dated Sep. 10, 2009.
U.S. Appl. No. 11/247,993, Office Action dated Jan. 6, 2010.
PCT Application No. PCT/US2006/039521, International Search Report and Written Opinion dated Aug. 2, 2007.
PCT Application No. PCT/US2006/039521, International Preliminary Report on Patentability dated Apr. 24, 2008.
CN Application No. 200680046525.2, Office Action dated Jul. 10, 2009 (English translation).
EP Application No. 06 816 608.1-1241, Extended European Search Report dated Mar. 10, 2010.
U.S. Appl. No. 11/444,277, Office Action dated Aug. 5, 2008.
U.S. Appl. No. 11/444,277, Office Action dated May 7, 2009.
U.S. Appl. No. 11/444,277, Office Action dated Nov. 18, 2009.
PCT Application No. PCT/US2007/013014, International Search Report and Written Opinion dated Aug. 27, 2008.
PCT Application No. PCT/US2007/013014, International Preliminary Report on Patentability dated Dec. 18, 2009.
CN Application No. 200780026542.4, Office Action dated Nov. 13, 2009 (English translation).
EP Application No. 05 713 765.5-2202, Office Action dated Feb. 25, 2010.
JP Application No. 2006-554218, Office Action dated Jul. 28, 2010.
U.S. Appl. No. 11/247,993, Notice of Allowance dated May 4, 2010.
CN Application No. 200680046525.2, Office Action dated Mar. 25, 2010.
U.S. Appl. No. 11/444,277, Office Action dated Aug. 3, 2010.

* cited by examiner

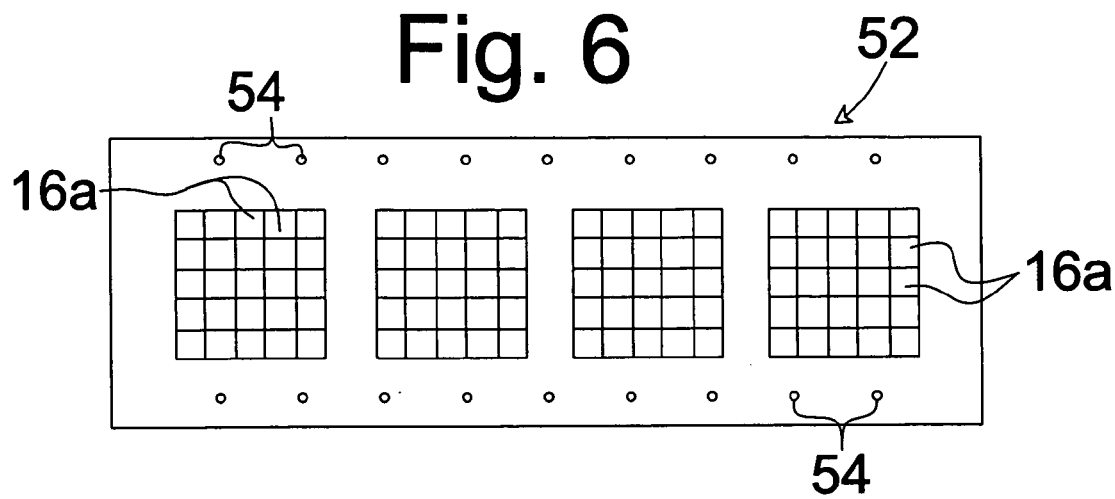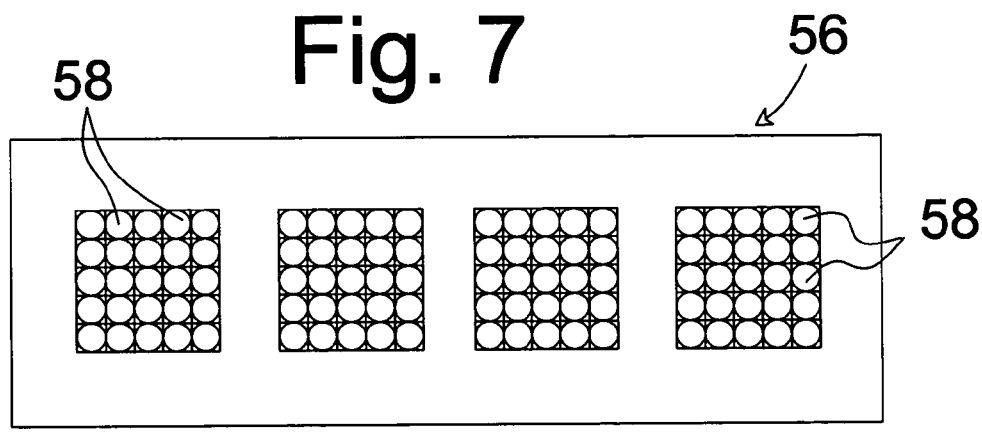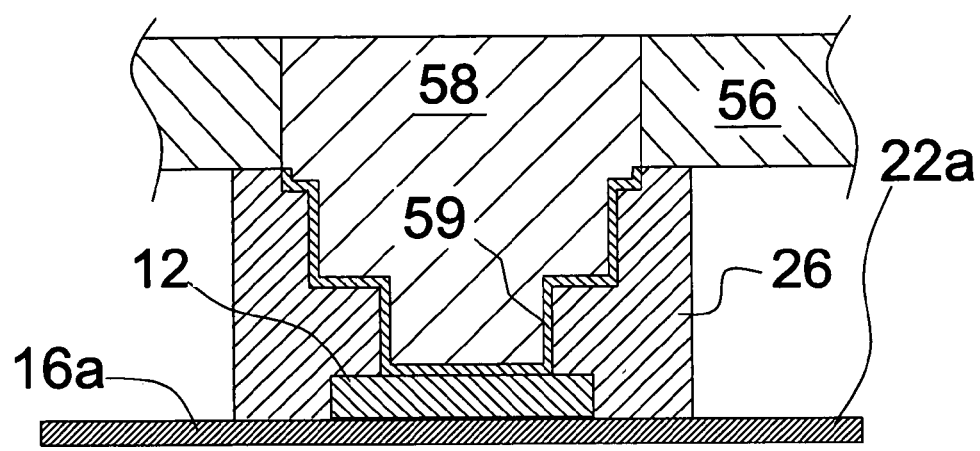

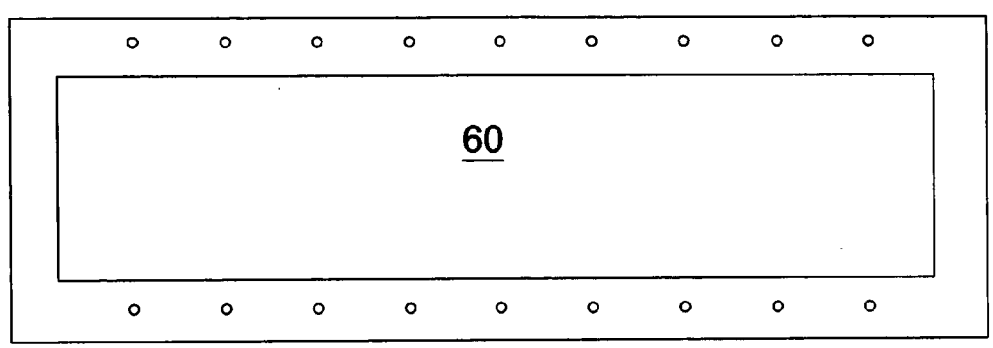
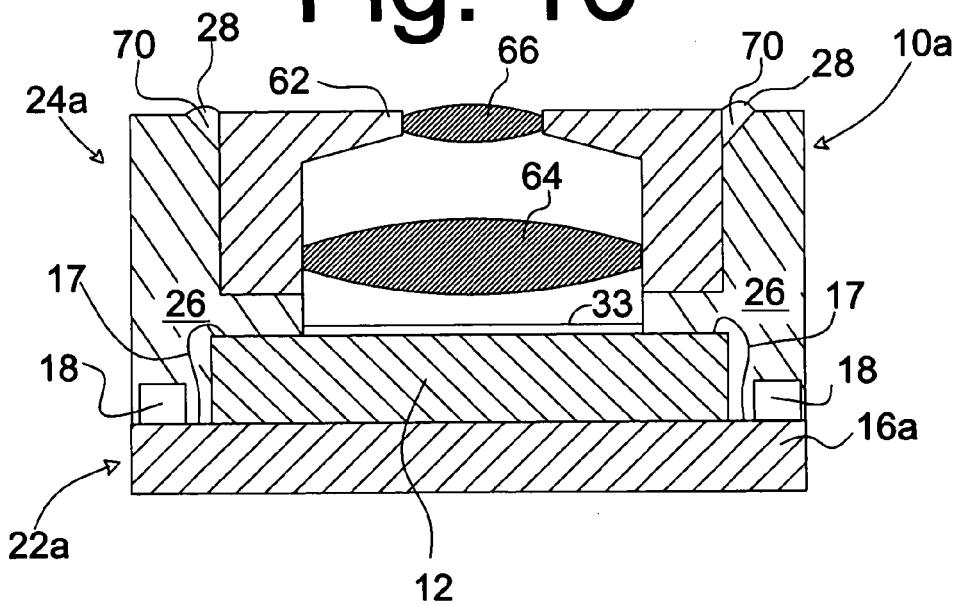

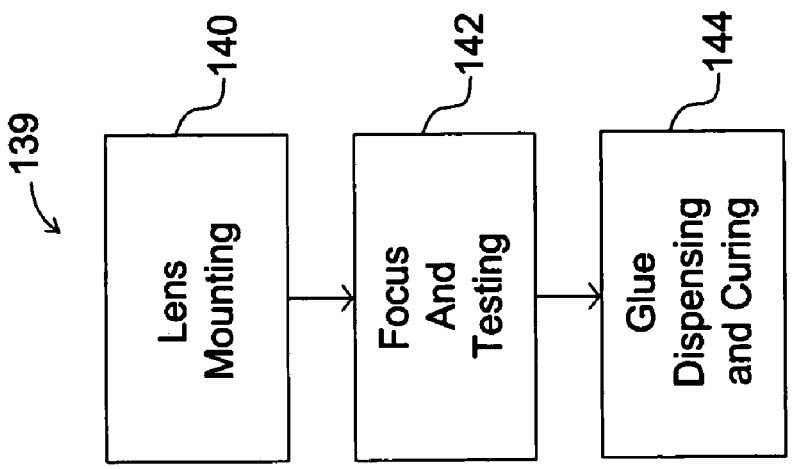
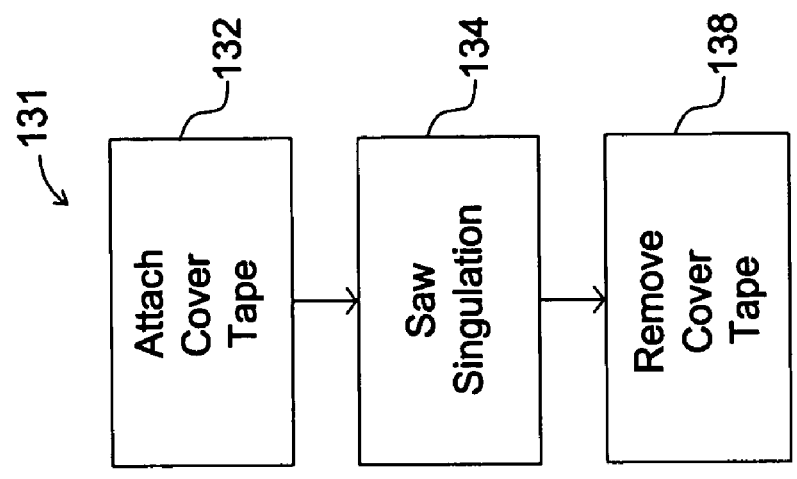
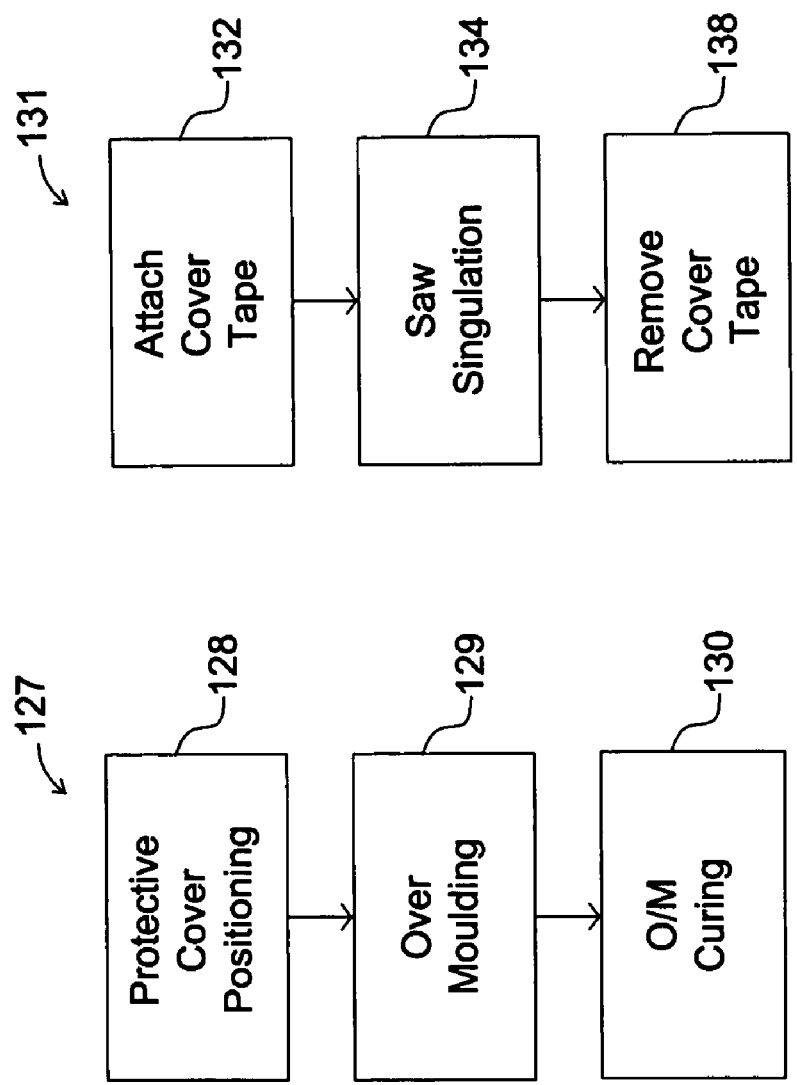

INTEGRATED LENS AND CHIP ASSEMBLY FOR A DIGITAL CAMERA

BACKGROUND OF THE INVENTION

1. Field of the Invention

The present invention relates generally to the field of digital camera devices, and more particularly to a novel combined array chip and lens apparatus. The predominant current application for the inventive integrated lens and chip assembly is in the production of low cost cameras, wherein the ability to produce high quality pictures without expensive or complicated camera assemblies is an important factor.

2. Description of the Background Art

Very small digital camera modules, adapted for use in small inexpensive cameras, cell phones, hand held devices, and the like, are greatly in demand. In the prior art, such modules have included generally conventional integrated chip and/or chip on board assemblies, which are enclosed in a mechanical housing. A lens block or assembly is attached to the chip housing and mechanically aligned thereto. This arrangement requires a significant quantity of parts used in the attachment process. It also generally requires some sort of attachment apparatus or jig for holding the pieces in alignment while they are attached. It is also very labor intensive. Additionally, the attachment mechanism is generally rather delicate and can easily be jarred out of position if the resulting device is dropped, or the like.

It would be desirable to have a method for producing a small camera module which is small in size, inexpensive to manufacture, and durable and reliable in operation. However, to the inventors' knowledge, the above described arrangement of components is that being used in the production of such devices prior to the advent of the presently described invention.

SUMMARY

Accordingly, it is an object of the present invention to provide a camera module which is easy and inexpensive to manufacture.

It is another object of the present invention to provide a camera module which can be very small in size.

It is still another object of the present invention to provide a camera module, which is rugged and reliable in operation.

It is yet another object of the present invention to provide a camera module in which the lens is accurately located, thereby providing for optimal picture quality without the need for active alignment.

Briefly, an example of the present invention has a lens assembly, which is rigidly affixed in relationship to a camera chip using a molded component. The molded component is formed in place on a printed circuit board on which the camera chip is already mounted. The lens assembly is then inserted into the molded component and held in place therein by an adhesive. According to the present inventive method and apparatus, a lens is accurately affixed in relationship to the sensor surface of the camera chip using a minimum of components and a minimum of operations steps. The size of the resulting unit can be quite small and the unit is also rugged and reliable in operation.

These and other objects and advantages of the present invention will become clear to those skilled in the art in view of the description of modes of carrying out the invention, and the industrial applicability thereof, as described herein and as illustrated in the several figures of the drawing. The objects and/or advantages listed or discussed herein are not an exhaustive list of all possible objects or advantages of the invention. Moreover, it will be possible to practice the invention even where one or more of the intended objects and/or advantages might be absent or not required in the application.

Further, those skilled in the art will recognize that various embodiments of the present invention may achieve one or more, but not necessarily all, of the above described objects and/or advantages. Accordingly, the listed objects and advantages are not essential elements of the present invention, and should not be construed as limitations.

BRIEF DESCRIPTION OF THE DRAWINGS

FIG. 6 is a top plan view of a substrate strip such as can be used to implement the present invention;

FIG. 7 is a top plan view of a molding chase such as can be used to implement the present invention;

FIG. 8 is a cross sectional side elevational view of one of the mold inserts of FIG. 7;

FIG. 9 is a top plan view showing the substrate strip of FIG. 6 with a protective tape in place thereon;

FIG. 10 is a cross sectional side elevational view of an alternative example of the inventive integrated camera and lens assembly;

FIG. 13 is a flow chart summarizing one particular method for performing an overmolding lens mount step of FIG. 11;

FIG. 14 is a flow chart summarizing one particular method for performing a device separation step of FIG. 11; and FIG. 15 is a flow chart summarizing one particular method for performing a lens mounting step of FIG. 11.

DETAILED DESCRIPTION OF THE INVENTION

Figure 1:
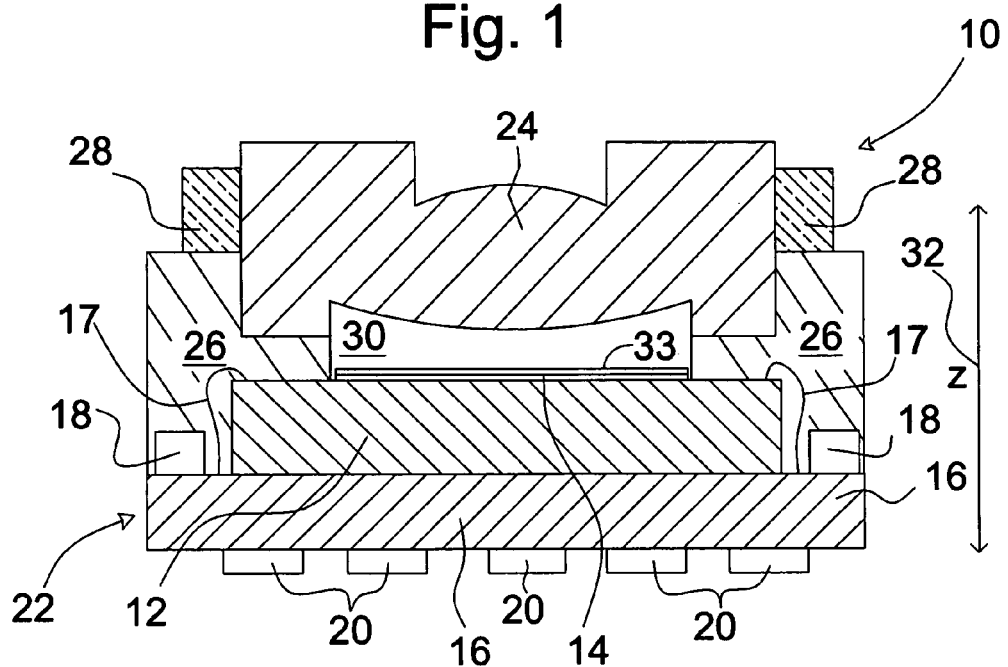
FIG. 1 is a cross sectional side elevational view of an example of an integrated camera and lens assembly according to the present invention.

This invention is described in the following description with reference to the Figures, in which like reference numbers represent the same or similar elements. While this invention is described in terms of modes for achieving this invention's objectives, it will be appreciated by those skilled in the art that variations may be accomplished in view of these teachings without deviating from the spirit or scope of the present invention. The embodiments and variations of the invention described herein, and/or shown in the drawings, are presented by way of example only and are not limiting as to the scope of the invention. Unless otherwise specifically stated, individual aspects and components of the invention may be omitted or modified, or may have substituted therefore known equivalents, or as yet unknown substitutes such as may be developed in the future or such as may be found to be acceptable substitutes in the future. The invention may also be modified for a variety of applications while remaining within the spirit and scope of the claimed invention, since the range of potential applications is great, and since it is intended that the present invention be adaptable to many such variations.

In the following description, details of some well known and/or commonly commercially available component parts have not been specifically discussed in detail, so as to avoid unnecessary complexity which might obscure disclosure of the true nature of the present invention. It should be noted that the diagrammatic representations in the drawings accompanying this description are not necessarily drawn in the scale and proportion which might be used in the actual practice of the invention. Rather the drawings are intended only to demonstrate the relative arrangement of certain aspects of the invention and to assist in the understanding of the important inventive aspects.

A known mode for carrying out the invention is an integrated camera module. The inventive integrated camera module is depicted in a side elevational view in FIG. 1 and is designated therein by the general reference character 10. The integrated camera module 10 has a camera chip 12 which is, in and of itself, not different from other camera chips such as are now in use or such as might be developed in the future. One skilled in the art will recognize that the camera chip 12 will have thereon a sensor array area 14 and will also contain many of the additional components (timing, and the like) necessary or desirable for causing the sensor array area 14 to capture an image. In the example of FIG. 1 the camera chip 12 is attached (as will be discussed in greater detail hereinafter) to a printed circuit board ("PCB") 16. The camera chip 12 is electrically connected to the PCB 16 by a plurality (only two of which are visible in the view of FIG. 1) of wire bond attachment wires 17.

The PCB 16 has thereon a plurality of passive components 18 which, in conjunction with components on the camera chip 12, constitute the internal circuitry of the integrated camera module 10. Optionally, the PCB 16 can, in some applications, have a plurality (only a few of which are shown in the view of FIG. 1 for the sake of clarity) of bottom contact pads 20 for connecting the integrated camera module 10 electrically to external components (not shown), such as an operating button, optional flash circuitry, external digital memory, external control circuitry, or the like. Together, the above described components form a PCB assembly 22 which, in many respects, is not significantly different from those currently in use in similar camera modules.

According to the present invention, a lens assembly 24 is positioned in relation to the PCB assembly 22 by a molding 26 and held in place therein by an adhesive 28. The molding 26 is formed by a molding material on the PCB assembly 22 as will be discussed in greater detail hereinafter. The molding 26 has dimensional tolerances sufficiently accurate such that when the lens assembly 24 is positioned within a recessed area 29 (FIG. 2) in the molding 26, as shown in the example of FIG. 1, then a gap 30 is appropriate for the focus of the lens assembly 24 in relation to the PCB assembly 22. As shown in FIG. 1, a spacer portion of the molding 26 separates the lens assembly 24 and the camera chip 12. Optimal distance between the lens assembly 24 and the sensor array 14 is determined by the geometry and materials of the particular lenses used. The height of the gap 30 is a function of the placement of the lens assembly 24 in a Z dimension 32, as can be seen in the view of FIG. 1, which placement will be discussed in greater detail hereinafter.

Note that lens assembly 24 is not intended to depict any particular lens design, but rather is shown representationally for illustrative purposes. Depending on the particular design, lens assembly 24 can be formed from a single piece of material, can include one or more lenses mounted in a carrier (e.g., FIG. 10), or can include additional optical components.

A protective cover 33 is mounted over sensor array area 14, to protect sensor array area 14 from damage during the manufacturing and assembly process. Preferably, protective cover 33 is formed from a robust, optically inactive material. In one particular embodiment, protective cover is a glass cover sheet, which can be mounted over sensor array area 14 either before or during the formation of molding 26.

Figure 2:
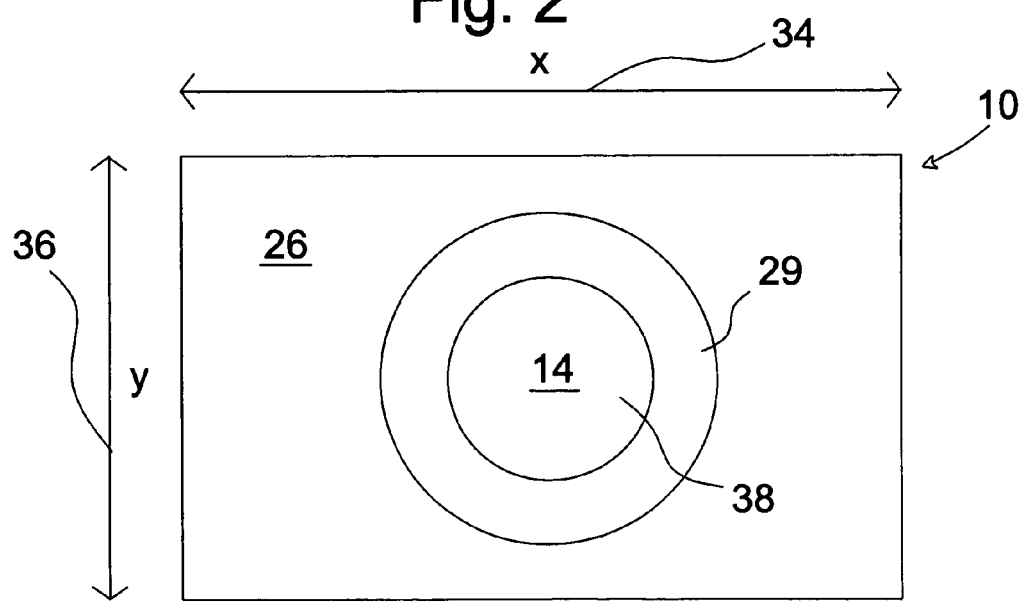
FIG. 2 is a top plan view of a partially assembled integrated camera and lens assembly according to the present invention.

FIG. 2 is a diagrammatic top plan view of the integrated camera module 10 of FIG. 1 before the lens assembly 24 is positioned thereon. As can be seen in the view of FIG. 2, placement of the lens assembly 24 (FIG. 1) in an X dimension 34 and a Y dimension 36 is accomplished by the position and tolerances of the recessed area 29 in the molding 26. An aperture 38 in the molding 26 is provided such that the sensor array area 14 can be seen there through.

Figure 3:
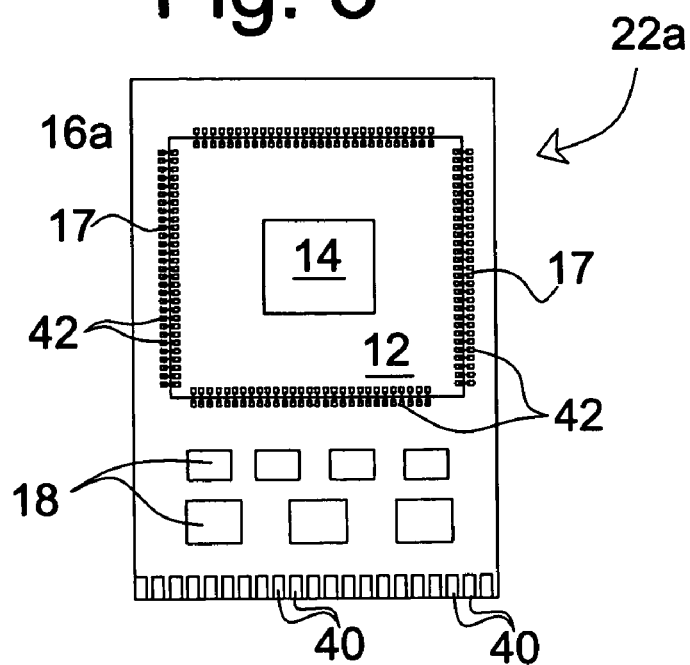
FIG. 3 is a top plan view of another example of a PCB assembly according to the present invention.

FIG. 3 is a top plan view of another example of a PCB assembly 22a. In the example of FIG. 3 it can be seen that the camera chip 12 is affixed (by an adhesive, in this example) to the alternate PCB 16a. A great plurality of the attachment wires 17 are connected to a like plurality of attachment pads 42 on the alternate PCB 16a for making electrical connection between the alternate PCB 16a and the camera chip 12. The alternate PCB assembly 22a also has a plurality of attachment fingers 40 thereon for electrically connecting the alternate PCB assembly 22a to external circuitry. Unlike the example of FIG. 1, in the example of FIG. 3, all of the passive components 18 are located on one side of the camera chip 12.

Figure 4:
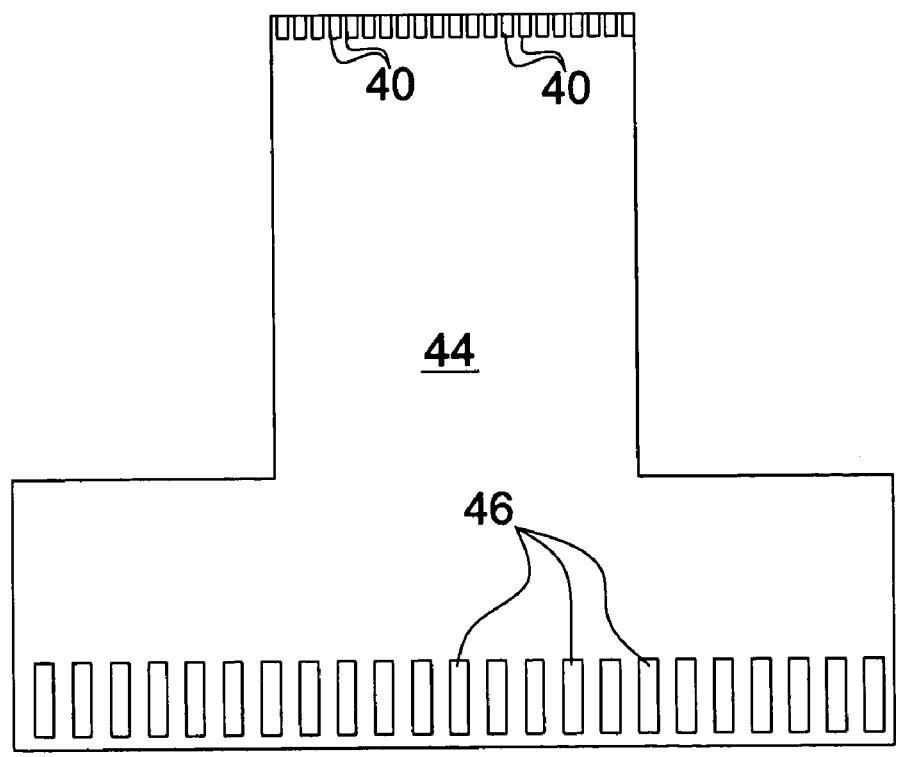
FIG. 4 is a bottom plan view of a flexible connector according to the present invention.

FIG. 4 is as bottom plan view of a flex circuit 44. The flex circuit 44 has a plurality of the attachment fingers 40 thereon for mating with the like plurality of attachment fingers 40 on the alternate PCB assembly. Furthermore, the flex circuit 44 has a plurality of edge connector pads 46 for connection to external circuitry.

Figure 5:
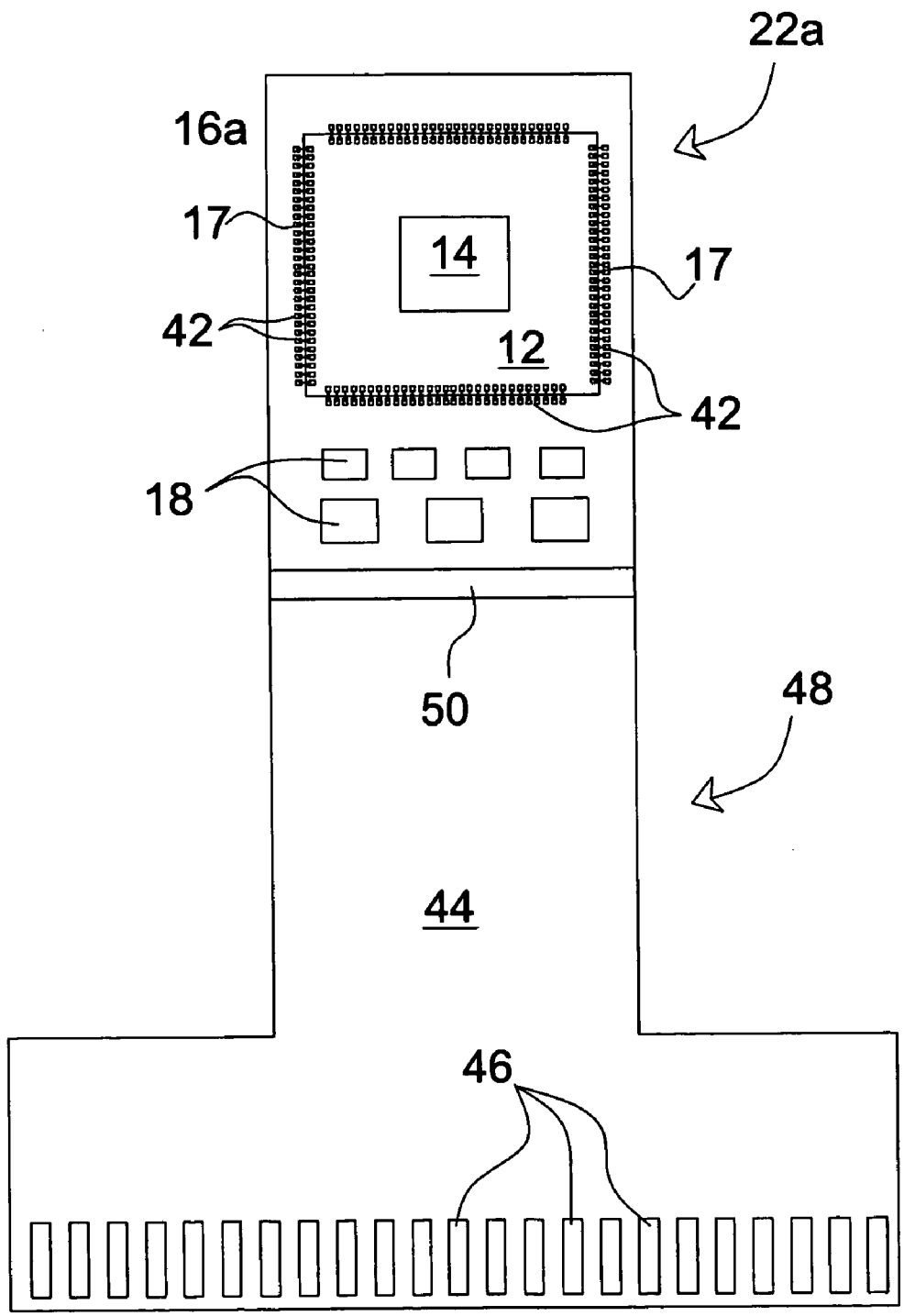
FIG. 5 is a top plan view of an assembled flexible PCB apparatus.

FIG. 5 is a top plan view of an assembled flex circuit assembly 48 having the alternate PCB assembly 22a of FIG. 3 affixed to the flex circuit 44 of FIG. 4. It should be noted that the alternate PCB assembly 22a could be attached directly to a rigid circuit board, or the like, without the flex circuit 44. However, in some applications, the flex circuit 44 will allow more freedom in the placement of the alternate PCB assembly 22a. Furthermore, additional circuitry can be included on the flex circuit 44 as may be necessary or required. The flex circuit 44 will include traces (not shown) for providing electrical connection between the attachment fingers 40 and the edge connector pads 46 and, as discussed above, optional additional circuitry as required. In the view of FIG. 5 it can be seen that, in the flex circuit assembly 48, the alternate PCB assembly 22a is connected to the flex circuit 44 at a hot bar attachment point 50 such that the attachment fingers 40 (not visible in the view of FIG. 5) mate as required. One skilled in the art will be familiar with the hot bar attachment method whereby the components are joined at the hot bar attachment point 50.

FIG. 6 is a top plan diagrammatic view of a substrate strip 52. The substrate strip 52 has a plurality (100 in the example shown) of the individual PCBs 16a included therein. The substrate strip 52 also has a plurality (18 in this example) of alignment holes 54 for aligning the substrate strip 52 in one or more placement jigs (not shown).

FIG. 7 is a top plan diagrammatic view of a mold chase 56 such as might be used to accomplish the present invention. The mold chase 56 is constructed of a metal such as stainless steel. The mold chase as adapted for holding in place a plurality (100 in this example) of mold inserts 58. The mold inserts 58 are positioned such that one mold insert 58 is correctly aligned over each of the PCBs 16a on the substrate strip 52 (FIG. 6) when the mold chase 56 is aligned over the substrate strip 52.

FIG. 8 is a diagrammatic side elevational view of one of the mold inserts 58 in position over one of the alternate PCB assemblies 22a. As will be discussed in greater detail hereinafter, the alternate PCB assemblies 22a are constructed on the substrate strip 52, except as noted herein, before the substrate strip 52 is separated into the individual alternate PCB assemblies 22a. As can be seen in the view of FIG. 8, mold insert 58 is coated with a compliant, nonadherent layer of material 59, to prevent damage to the underlying sensor 12 and/or to prevent adhesion of the molding 26 material to mold insert 58. The specific material used for coating 59 will depend on the specific composition of molding 26, as is known to those skilled in the art, and in some applications, coating material 59 can be omitted. Thus, coating material 59 is not considered to be an essential element of the present invention. It should be noted that the molding process, itself, is not peculiar to the present invention. In place molding techniques are well known in the art, and one skilled in the art will be familiar with the details necessary to properly form the molding 26 and equivalents discussed herein.

FIG. 9 is a top plan view of an example of the substrate strip 52 with a protective tape 60 in place thereon to protect the PCB assemblies 16a (not visible in the view of FIG. 9) during some assembly of the invention. Use of the protective tape 60 will be discussed in greater detail hereinafter in relation to the inventive method for producing the integrated camera module 10.

FIG. 10 is yet another example of an integrated camera module 10a according to the present invention. In the view of FIG. 10 it can be seen that an alternate lens assembly 24a has a plastic lens housing 62, a first lens 64 and a second lens 66. One skilled in the art will recognize that the integrated camera module 10a will generally require two lenses. Therefore, an arrangement such as is illustrated in the view of FIG. 10 is considered by the inventors to be optimal. However, the invention can be practiced using only one lens. The distance between the first lens 64 and the second lens 66 is fixed by the construction of the lens housing 62. The distance between the first lens 64 and the camera chip 12 is set as will be discussed hereinafter. In the example of FIG. 10, an adhesive well 70 is provided around the circumference of the molding 26 for accepting the adhesive 28 which holds the lens assembly 24a in place within the molding 26.

Figure 11:
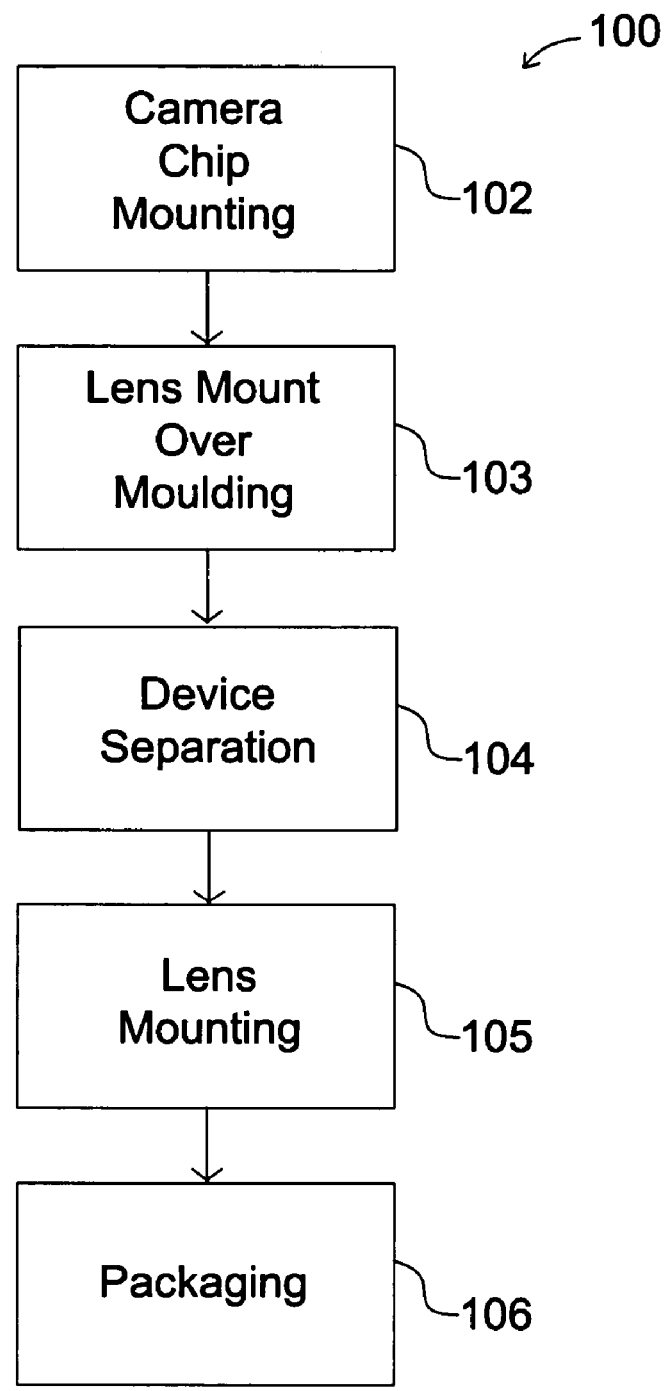
FIG. 11 is a flow diagram depicting the inventive method for producing an integrated camera and lens assembly.

FIG. 11 is a flow diagram depicting an example of the present inventive camera module construction method 100. In this particular example, a plurality of camera modules are constructed at the same time. First, in a "camera chip mounting" operation 102, one or more camera chips 12 are mounted to one or more PCBs 16a, respectively (FIG. 6). Next, in a "lens mount overmolding" operation 103, a lens mount 26 is molded over each camera chip 12. Then, in a "device separation" operation 104, the PCBs 16a are separated (e.g., sawn apart) from one another. Next, in a "lens mounting" operation 105, a lens housing 62 is mounted into each lens mount molding 26 (FIG. 10). Finally, in a "packaging" operation 106, the completed integrated camera modules 10a are packaged for shipment to the makers of miniature cameras, telephone cameras, and the like, or optionally for attachment to the flex circuit 44 as previously discussed herein.

Figure 12:
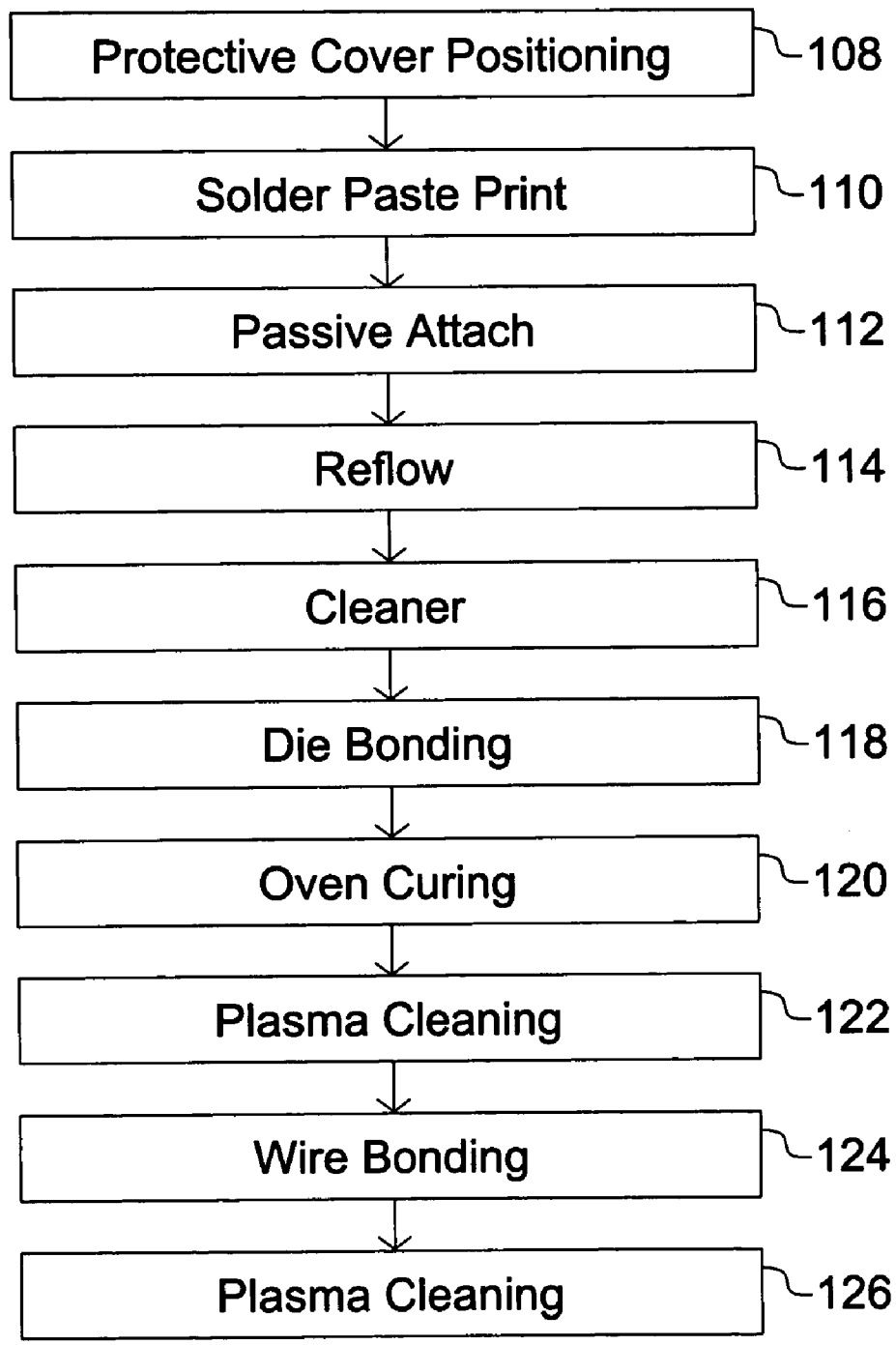
FIG. 12 is a flow chart summarizing one particular method for performing a camera chip mounting step of FIG. 11.

FIG. 12 is a flow chart summarizing one particular method 107 for performing camera chip mounting operation 102 of method 100. First, in a "protective cover position" operation 108, protective cover 33 is positioned over camera chip 12 (FIG. 10). Optionally, protective cover 33 can be positioned during lens mount overmolding operation 103, at another point in camera chip mounting operation 102, or omitted. Next, in a "solder paste print" operation 110 solder waste traces are printed on the individual PCBs 16a of the substrate strip 52. In a "passive attach" operation 112 the passive components 18 are placed on the PCBs 16a. In a "reflow" operation 114, the substrate strip 52 is subjected to a reflow soldering operation, and in a "cleaner" operation 116, the substrate strip 52 is subjected to conventional cleaning following the reflow soldering process 114.

In a "die bonding" operation 118 the camera chips 12 are bonded (by an adhesive in this example) to the respective PCBs 16a. In an "oven curing" operation 120, the adhesive applied in the previous operation is cured in an oven. In a "plasma cleaning" operation 122 surfaces to which wires are to be bonded (in subsequent operations) are etched using inert gasses. In a "wire bonding" operation 124 the attachment wires 17 are bonded using thermosonic bonding. In a second "plasma cleaning" operation 126 the PCBs 16a are again cleaned.

FIG. 13 is a flow chart summarizing one particular method 127 of performing lens mount overmolding operation 103 of method 100. In a protective cover positioning operation 128, protective cover 33 is positioned over camera chip 12. Note that this step is unnecessary if protective cover 33 has already been mounted as part of a prior process, or if no protective cover is desired. Then, in an "over molding" operation 129, the mold chase 56 is placed over the substrate strip 52 and the molding 26 is formed as previously discussed herein. In addition to the functionality already described herein, molding 26 can also serve to hold protective covering 33 in place, essentially sealing in the sensor array area 14 of camera chip 12. The molding 26 is formed using generally conventional "overmolding" techniques known to those skilled in the art. The mold will provide for exposure of the sensor array area 14 of the camera chip 12 after the molding operation. Finally, in an "O/M curing" operation 130, the molding 26 is briefly heat cured.

FIG. 14 is a flow chart summarizing one particular method 131 of performing device separation operation 104 of FIG. 11. First, the protective tape 60 is placed over all of the PCBs 16a (as illustrated in FIG. 9) in an "attach cover tape" operation 132. Then, in a "saw singulation" operation 134, the individual PCBs 16a are sawn apart. The sawing is done right through the protective tape 60 such that the resulting product is a plurality of the individual PCB assemblies 22a, each having a respective portion of the protective tape 60 still in place thereon. The protective tape 60 is a commonly available commodity provided for protecting components during a soldering process, and the like. Finally, in a "remove cover tape" operation 138, the bits of the protective tape 60 are removed from each of the PCB assemblies 22a.

FIG. 15 is a flow chart summarizing one particular method 139 of performing lens mounting operation 105 of method 100. In a "lens mounting" operation 140, one of the lens assemblies 24a is inserted into each of the moldings 26 (FIG. 10). In a "focus and testing" operation 142, the lens assembly 24a is moved up and down (along the Z axis 32 of FIG. 1) to perfect the focus of the lens assembly 24a in relation to the sensor array area 14 of the camera chip 12. Correct focus is determined by generally conventional automatic testing equipment. It should be noted that the inventors believe that this operation might be eliminated in the future by referencing the position of the mold chase 56 in relation to the camera chip 12 during the "over molding" operation 128. Finally, in a "glue dispensing and curing" operation 144, ultra violet cure adhesive 28 is applied as previously discussed herein, and then cured using ultra violet light.

Various modifications may be made to the invention without altering its value or scope. For example, the sizes, shapes and quantities of components shown and described in relation to the examples discussed herein could each or all be varied according the needs or convenience of a particular application.

Similarly other substrate materials, such as ceramics, could be used instead of the PCB 16 described herein.

Another modification would be to replace the air filled gap 30 described herein with an optically clear spacer made, for example, of clear plastic, glass, or some other optically acceptable material. Providing a spacer which abuts both the camera chip 12 and the lens 24 could eliminate the need to focus the lens during the lens mounting operation. Also, secondary lenses, such as zoom lens assemblies and the like, can be fit to the already mechanically centered lens assembly 24 or 24*a*. A spacer would also serve as a protective cover, thereby eliminating the need to provide a separate protective cover.

While the inventors presently believe that mounting the lens assemblies 24, 24*a* into the molding 26, or the like, by an adhesive is presently the most viable method, it is within the scope of the invention that the lens assemblies 22, 22*a* could be secured to the PCB 16, 16*a* in relation to the camera chip 12 by other mechanical means, such as a mechanical clip, or the like.

Obvious variations to the method could include mounting the lens assemblies 24*a* into the molding 26 before the "saw singulation" operation 134. Of course, this would require some other modifications to the method to insure that the sensor array area 14 is protected during the "saw singulation" operation 134, and the like.

Additional components and/or parts could readily be added to the present invention. One possible example would be to provide a glass cover on the molding 26. Such as cover might serve several purposes. It could protect the sensor array area 14 during storage, transport and handling, it could optionally provide a service whereby the device could be lifted by "pick-and-place" machines, and it could protect the sensor array area 14 during reflow soldering operations.

All of the above are only some of the examples of available embodiments of the present invention. Those skilled in the art will readily observe that numerous other modifications and alterations may be made without departing from the spirit and scope of the invention. Accordingly, the disclosure herein is not intended as limiting and the appended claims are to be interpreted as encompassing the entire scope of the invention.

INDUSTRIAL APPLICABILITY

The inventive integrated camera module 10, 10*a* is intended to be widely used for capturing visual images in very small devices such as small digital cameras, cellular telephones, and the like. The device and method are appropriate to a wide variety of applications, including using sensor modules ranging from VGA resolution to 1.3 Megapixel or even greater. The method and apparatus described herein are inexpensive in the molding material and process is lower in cost as compared to the attachment of a housing using conventional methods. This is mainly because the molding process will be performed on an entire panel having thereon a large number of the integrated camera modules 10 at once, rather than attaching the lenses one at a time. Also, the cost of molding compound will be lower than the cost of individual housing pieces formerly used for attaching the lenses.

According to the present invention, the final assembly of the integrated camera modules 10 will be more robust and more accurate with respect to X and Y locations. This is accomplished by ensuring that the sensor die placement and the overmold insert locations are controlled by the same local fiducial features on the substrate. Current methods involve use of guide pins and other means for the placement of the housing. These inherently involve greater tolerance build up compared to a mold with greater dimensional accuracy and more stable dimensions.

As discussed previously herein, Z dimension accuracy will be accomplished with reference to the camera chip 12 surface itself, which is the key reference for camera focus. It is anticipated that, in the future, this will obviate the need for active alignment in most cases. Also, the fact that the alignment is done without having to rotate the lens assembly into a threaded housing will inherently make the lens placement more stable.

It is further anticipated that the reduction in the required number of components according to the present invention will, itself, result in additional cost savings.

Since the integrated camera module 10, 10*a* of the present invention may be readily produced and integrated with existing design configurations for camera systems and others yet to be conceived, and since the advantages as described herein are provided, it is expected that it will be readily accepted in the industry. For these and other reasons, it is expected that the utility and industrial applicability of the invention will be both significant in scope and long-lasting in duration.

We claim:

1. A camera module apparatus, comprising:
   a camera integrated circuit chip;
   a lens; and
   a molding made directly on the camera integrated circuit chip for holding the lens such that the lens is positioned in relation to the camera integrated circuit chip by the molding, the molding defining a recess and a spacer, the recess for receiving the lens and the spacer located adjacent a top surface of the camera integrated circuit chip and separating the lens and the camera integrated circuit chip; and wherein
   the camera integrated circuit chip is mounted on a printed circuit board; and
   the molding abuts the camera integrated circuit chip on at least two surfaces of the camera integrated circuit chip.

2. The camera module apparatus of claim 1, further comprising:
   a protective cover over the camera integrated circuit chip.

3. The camera module apparatus of claim 2, wherein:
   the protective cover is a glass sheet.

4. The camera module apparatus of claim 2, wherein:
   the protective cover is located between the spacer and the top surface of the camera integrated circuit chip; and
   the spacer retains the protective cover on the camera integrated circuit chip.

5. The camera module apparatus of claim 1, wherein:
   the lens is held in place on the molding by an adhesive.

6. The camera module apparatus of claim 1, wherein:
   the spacer positions the lens relative to the camera integrated circuit chip.

7. The camera module apparatus of claim 1, wherein:
   the top surface of the camera integrated circuit chip includes a sensor array; and
   the molding is made on the top surface.

8. The camera module apparatus of claim 1, wherein:
   the spacer fixes the distance between the lens and the camera integrated circuit chip.

9. An integrated camera circuit and lens module, comprising:
- a printed circuit board;
- a camera integrated circuit mounted on the printed circuit board;
- a lens assembly; and
- a holder made directly on the camera integrated circuit, the holder defining a spacer located adjacent a top surface of the camera integrated circuit, the spacer separating the lens assembly and the camera integrated circuit; and wherein
- the lens assembly is affixed to the camera integrated circuit via the holder, the holder enabling the insertion of the lens assembly into the holder, thereby positioning the lens assembly with respect to the camera integrated circuit; and
- the holder abuts the camera integrated circuit on at least two surfaces of the camera integrated circuit.

10. The integrated camera circuit and lens module of claim 9, wherein:
- the lens assembly is rigidly affixed to the camera integrated circuit via the holder; and
- the spacer causes a gap between at least a portion of the lens assembly and a sensor array of the camera integrated circuit.

11. The integrated camera circuit and lens module of claim 9, wherein:
- the holder is a molded component.

12. The integrated camera circuit and lens module of claim 11, wherein:
- the lens assembly is attached to the holder by an adhesive.

13. The integrated camera circuit and lens module of claim 9, further comprising:
- a protective cover held in place over the camera integrated circuit by the holder.

14. The integrated camera circuit and lens module of claim 13, wherein:
- the protective cover is a glass sheet.

15. The integrated camera circuit and lens module of claim 9, wherein:
- the top surface of the camera integrated circuit includes a sensor array; and
- the holder is made on the top surface.

16. The integrated camera circuit and lens module of claim 9, wherein:
- the spacer fixes the distance between the lens assembly and the camera integrated circuit.

17. A method for producing a camera module, comprising:
- molding a receptacle over a camera integrated circuit such that the receptacle is capable of receiving a lens assembly and positioning the lens assembly with respect to the camera integrated circuit, the receptacle defining a spacer capable of separating the lens assembly and the camera integrated circuit, the spacer located adjacent a top surface of the camera integrated circuit;
- inserting the lens assembly into the receptacle; and
- securing the lens assembly into the receptacle.

18. The method of claim 17, wherein:
- the lens assembly is secured to the receptacle by an adhesive.

19. The method of claim 17, wherein:
- the camera integrated circuit is secured the circuit board before the receptacle is molded over the camera integrated circuit.

20. The method of claim 17, wherein:
- the receptacle includes a recessed portion for receiving the lens assembly.

21. The method of claim 20, wherein:
- the spacer is a projection that fixes the distance of the lens assembly from the camera integrated circuit.

22. The method of claim 17, wherein:
- the camera module is affixed to a flex circuit.

23. The method of claim 17, further comprising:
- placing a protective cover over the camera integrated circuit.

24. The method of claim 23, wherein:
- the placing of the protective cover over the camera integrated circuit occurs during the molding of the receptacle over the integrated circuit.

25. The method of claim 23, wherein:
- the protective cover is a glass plate.

26. The method of claim 23, wherein:
- the protective cover is located between the spacer and the top surface of the integrated circuit; and
- the spacer retains the protective cover over the integrated circuit.

27. The method of claim 17, wherein:
- the molding of the receptacle over the integrated circuit includes contacting a top surface of the integrated circuit with a mold insert.

28. The method of claim 27, wherein:
- the mold insert includes a compliant surface to protect the integrated circuit.

29. The method of claim 17, wherein:
- the molding of the receptacle over the integrated circuit includes simultaneously molding a receptacle over each of a plurality of integrated circuits.

30. The method of claim 17, wherein:
- the molding of the receptacle over the integrated circuit occurs at a time when the integrated circuit is physically coupled to other integrated circuits.

31. The method of claim 30, wherein:
- the molding of the receptacle over the integrated circuit includes simultaneously molding receptacles over at least some of the other integrated circuits.

32. The method of claim 30, wherein:
- the integrated circuit and the other integrated circuits are physically coupled by being mounted on a unitary substrate; and
- the integrated circuit and the other integrated circuits are subsequently separated by dividing the unitary substrate.

33. The method of claim 17, wherein:
- the spacer fixes the distance between the lens assembly and the integrated circuit.

34. A camera apparatus, comprising:
- a circuit board;
- an integrated circuit camera apparatus having thereon a photosensitive array, the integrated circuit camera apparatus being affixed to the circuit board;
- a lens assembly for focusing light on the photosensitive array; and
- a spacer separating the lens assembly and the integrated circuit camera apparatus; and
- wherein
  - the lens assembly is positioned and rigidly affixed on the integrated circuit camera apparatus by a lens assembly receiving apparatus made integrally and directly on the integrated circuit camera apparatus;
  - the lens assembly receiving apparatus abuts the integrated circuit camera apparatus on at least two surfaces of the integrated circuit camera apparatus; and the spacer is an integral portion of the lens assembly receiving apparatus, the spacer located adjacent a top surface of the integrated circuit camera apparatus.

35. The camera apparatus of claim 34, wherein:
the lens assembly has a housing for receiving at least one lens.

36. The camera apparatus of claim 34, wherein:
the lens assembly has a housing for receiving two lenses.

37. The camera apparatus of claim 34, wherein:
the lens assembly receiving apparatus is formed at least partially on the circuit board.

38. The camera apparatus of claim 37, wherein:
the lens assembly receiving apparatus is a molded receptacle.

39. The camera apparatus of claim 37, wherein:
the lens assembly is rigidly affixed within the lens assembly receiving apparatus.

40. The camera apparatus of claim 37, wherein:
the lens assembly is affixed within the lens assembly receiving apparatus by an adhesive.

41. The camera apparatus of claim 34, further comprising:
a protective cover fixed between the integrated circuit camera apparatus and the lens assembly by the lens assembly receiving apparatus.

42. The camera apparatus of claim 41, wherein:
the protective cover is a glass plate.

43. The camera apparatus of claim 41, wherein:
the lens assembly receiving apparatus is an overmold formed over the integrated circuit camera apparatus.

44. The camera apparatus of claim 41, wherein:
the protective cover is retained between the spacer and the integrated circuit camera apparatus.

45. The camera apparatus of claim 34, wherein:
the photosensitive array is on the top surface of the integrated circuit camera apparatus; and
the lens assembly receiving apparatus is made on the top surface.

46. The camera apparatus of claim 34, wherein:
the lens assembly receiving apparatus is an overmold formed over the integrated circuit camera apparatus; and
the spacer is part of the lens assembly receiving apparatus overmold.

47. The camera apparatus of claim 34, wherein:
the spacer fixes the distance between the lens assembly and the integrated circuit camera apparatus.

48. A camera module apparatus, comprising:
a printed circuit board;
a camera integrated circuit chip mounted on the printed circuit board;
a lens; and
means for holding the lens such that the lens is positioned in relation to the integrated circuit chip by the means for holding the lens, the means for holding the lens including a component molded directly on the camera integrated circuit chip, the component molded on the camera integrated circuit chip abutting the camera integrated circuit chip on at least two surfaces of the camera integrated circuit chip; and
wherein the component molded on the camera integrated circuit chip includes a means for separating the lens and the camera integrated circuit chip.

49. A camera module apparatus, comprising:
a camera integrated circuit chip including a sensor array;
a lens;
a molding made on the camera integrated circuit chip for holding the lens such that the lens is positioned in relation to the camera integrated circuit chip by the molding, the molding including a recess for receiving the lens; and
an optically clear spacer located within the recess and adjacent a top surface of the camera integrated circuit chip, the spacer separating the lens and the camera integrated circuit chip when the lens is placed in the recess after the spacer; and wherein
the optically clear spacer abuts both the camera integrated circuit chip and the lens.

50. A camera module apparatus of claim 49, wherein:
the optically clear spacer is a protective cover positioned over the sensor array.

51. A camera module apparatus of claim 50, wherein:
the optically clear spacer is glass.

52. A camera module apparatus of claim 49, wherein:
the optically clear spacer is mounted over the camera integrated circuit chip before the molding is made.

53. A camera module apparatus of claim 49, wherein:
the optically clear spacer is mounted over the camera integrated circuit chip at the same time the molding is made.

54. A camera module apparatus of claim 49, wherein:
the camera integrated circuit chip is mounted on a printed circuit board.

55. A camera module apparatus of claim 49, wherein:
the camera integrated circuit chip is mounted on a flex circuit.

56. A camera module apparatus of claim 49, wherein:
the spacer fixes the distance between the lens and the camera integrated circuit chip.

57. A camera module apparatus of claim 49, wherein:
the lens is part of a lens assembly.

58. A camera module apparatus of claim 57, wherein:
the lens assembly has a housing for receiving said lens.

59. A camera module apparatus, comprising:
a camera integrated circuit chip including a sensor array;
a lens;
a molding made on the camera integrated circuit chip for holding the lens such that the lens is positioned in relation to the camera integrated circuit chip by the molding, the molding including a recess for receiving the lens; and
an optically clear spacer located within the recess and adjacent a top surface of the camera integrated circuit chip, the spacer separating the lens and the camera integrated circuit chip when the lens is placed in the recess after the spacer; and wherein
the optically clear spacer is mounted over the camera integrated circuit chip at the same time the molding is made.

60. A camera module apparatus of claim 59, wherein:
the optically clear spacer is a protective cover positioned over the sensor array.

61. A camera module apparatus of claim 60, wherein:
the optically clear spacer is glass.

62. A camera module apparatus of claim 59, wherein:
the camera integrated circuit chip is mounted on a printed circuit board.

63. A camera module apparatus of claim 59, wherein:
the camera integrated circuit chip is mounted on a flex circuit.

64. A camera module apparatus of claim 59, wherein:
the spacer fixes the distance between the lens and the camera integrated circuit chip.

65. A camera module apparatus of claim 59, wherein:
the lens is part of a lens assembly.

66. A camera module apparatus of claim 65, wherein:
the lens assembly has a housing for receiving said lens.

67. A camera module apparatus, comprising:
a camera integrated circuit chip including a sensor array;
a lens;
a molding made on the camera integrated circuit chip for holding the lens such that the lens is positioned in relation to the camera integrated circuit chip by the molding, the molding including a recess for receiving the lens; and
an optically clear spacer located within the recess and adjacent a top surface of the camera integrated circuit chip, the spacer separating the lens and the camera integrated circuit chip when the lens is placed in the recess after the spacer; and wherein
the spacer fixes the distance between the lens and the camera integrated circuit chip.

68. A camera module apparatus of claim 67, wherein:
the optically clear spacer is a protective cover positioned over the sensor array.

69. A camera module apparatus of claim 68, wherein:
the optically clear spacer is glass.

70. A camera module apparatus of claim 67, wherein:
the optically clear spacer is mounted over the camera integrated circuit chip before the molding is made.

71. A camera module apparatus of claim 67, wherein:
the camera integrated circuit chip is mounted on a printed circuit board.

72. A camera module apparatus of claim 67, wherein:
the camera integrated circuit chip is mounted on a flex circuit.

73. A camera module apparatus of claim 67, wherein:
the lens is part of a lens assembly.

74. A camera module apparatus of claim 73, wherein:
the lens assembly has a housing for receiving said lens.

* * * * *